United States Patent [19]

Min

[11] Patent Number: 5,072,134

[45] Date of Patent: Dec. 10, 1991

[54] INTERNAL VOLTAGE CONVERTER IN SEMICONDUCTOR INTEGRATED CIRCUIT

[75] Inventor: Dong-Sun Min, Seoul, Rep. of Korea

[73] Assignee: Samsung Electronics Co., Ltd., Suweon, Rep. of Korea

[21] Appl. No.: 484,107

[22] Filed: Feb. 22, 1990

[30] Foreign Application Priority Data

Jun. 10, 1989 [KR] Rep. of Korea ............. 89-8067 [U]

[51] Int. Cl.[5] ...................... H03K 3/013; H03K 3/353; G11C 7/02
[52] U.S. Cl. .............................. 307/296.2; 307/296.8
[58] Field of Search ............... 307/296.2, 296.6, 296.8, 307/296.1, 304

[56] References Cited

U.S. PATENT DOCUMENTS

| 4,471,290 | 9/1984 | Yamaguchi | 307/296.2 X |
|---|---|---|---|
| 4,733,108 | 3/1988 | Truong | 307/296.2 |
| 4,794,278 | 12/1988 | Vajdic | 307/296.2 |
| 4,961,007 | 10/1990 | Kumanoya et al. | 307/296.2 |
| 4,964,082 | 10/1990 | Sato et al. | 307/296.2 X |

Primary Examiner—Stanley D. Miller
Assistant Examiner—David R. Bertelson
Attorney, Agent, or Firm—Ladas & Parry

[57] ABSTRACT

An internal voltage converter in semiconductor integrated circuit, comprises an oscillator, a sub circuit including a buffer and a charge-pumping circuit and a power part, a main circuit including a buffer and a charge-pumping circuit and a power part, and a detector. A plurality of voltage converting stages are composed in parallel to be divided when operating so that the unnecesary consumption of the power is reduced in the case of providing the stand-by power and the stability of the internal power supply voltage is also improved.

7 Claims, 5 Drawing Sheets

INTERNAL VOLTAGE CONVERTER IN SEMICONDUCTOR INTEGRATED CIRCUIT

BACKGROUND OF THE INVENTION

The present invention relates to circuits used in semiconductor memory devices, particularly to an internal voltage converter which can remove an instability of the voltage and an excessive amount of stand-by current since the number of the operating internal voltage converting stages is different according to an amount of required current, that is, a large amount of current such as the case of a starting power supply or a small amount of current such as the case of a stand-by power supply.

Figure 1:
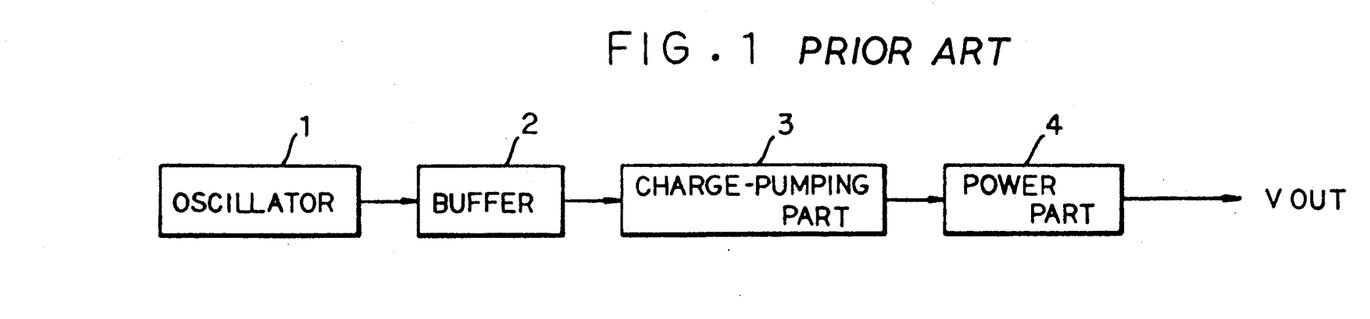
FIG. 1 is a block diagram of a conventional internal voltage converter in semiconductor integrated circuit.

As semiconductor devices have a tendency to high density, the size of various transistors used in the circuit becomes more and more reduced. According to the reduction tendency of the transistor size, there occurred disadvantages that the reliability of the transistor for the conventional power supply voltage is degraded and the power consumption of integrated circuits increases. Thus, the internal voltage converter as shown in FIG. 1 is included in the integrated circuit to improve such problems, but its power consumption is considerably large and it becomes the cause to degrade the stability of internal voltage.

SUMMARY OF THE INVENTION

It is an object of the present invention to provide an internal voltage converter in which a plurality of internal voltage converting stages are composed in parallel to be divided when operating so that the unnecessary consumption of the power is reduced in the case of providing the stand-by power and the stability of the internal power supply voltage is also improved.

A feature of the present invention resides in an internal voltage converter in semiconductor integrated circuit which has a plurality of parallel-connected internal voltage converting stages including an oscillator to generate a squarewave of a specified frequency, a buffer to drive a charge-pumping circuit after receiving the output of the oscillator as an input, a power circuit to control the level of an internal supply voltage by the charge-pumping circuit, and a detector to control the operation of the buffer by detecting the internal supply voltage.

Thus, the parallel-connected internal voltage converting stages include the buffer, charge-pumping circuit, and power circuit, respectively, and more than one converting stage is driven according to the stage of internal voltage supply.

BRIEF DESCRIPTION OF DRAWINGS

These and other objects, features, and advantages of the present invention will become more apparent from the following description for the preferred embodiments taken in conjunction with the accompanying drawings, in which:

FIGS. 5(a-b) is a timing diagram in the present invention.

DETAILED DESCRIPTION OF THE PREFERRED EMBODIMENTS

The present invention will be now described in more detail with reference to accompanying drawings.

FIG. 1 shows a block diagram of an internal voltage converter in a conventional semiconductor integrated circuit. This internal voltage converter is made in a semiconductor chip. This internal voltage converter includes an oscillator 1 constructed of inverters or Schmitt triggers, a buffer 2 to transmit a signal generated from the oscillator 1, a charge-pumping circuit 3 to generate a parameter-independent output by receiving the output of the buffer 2, and a power part 4 to provide a supply voltage VOUT by receiving the output of the charge-pumping part 3.

This voltage converter provides the output of the oscillator 1 to the charge-pumping part 3 through the buffer 2 and also provides the parameter-excited output of the charge-pumping part 3 as the supply voltage VOUT through the power transistor in the power part 4. This internal voltage converter always operates irrelevantly to the internal voltage and operation states in the semiconductor chip, so the unnecessary power is wasted in the stand-by mode of the chip. Also, there is no feedback of the internal voltage toward the input stage so that the stability of the internal voltage is deteriorated during active operation.

Figure 2:
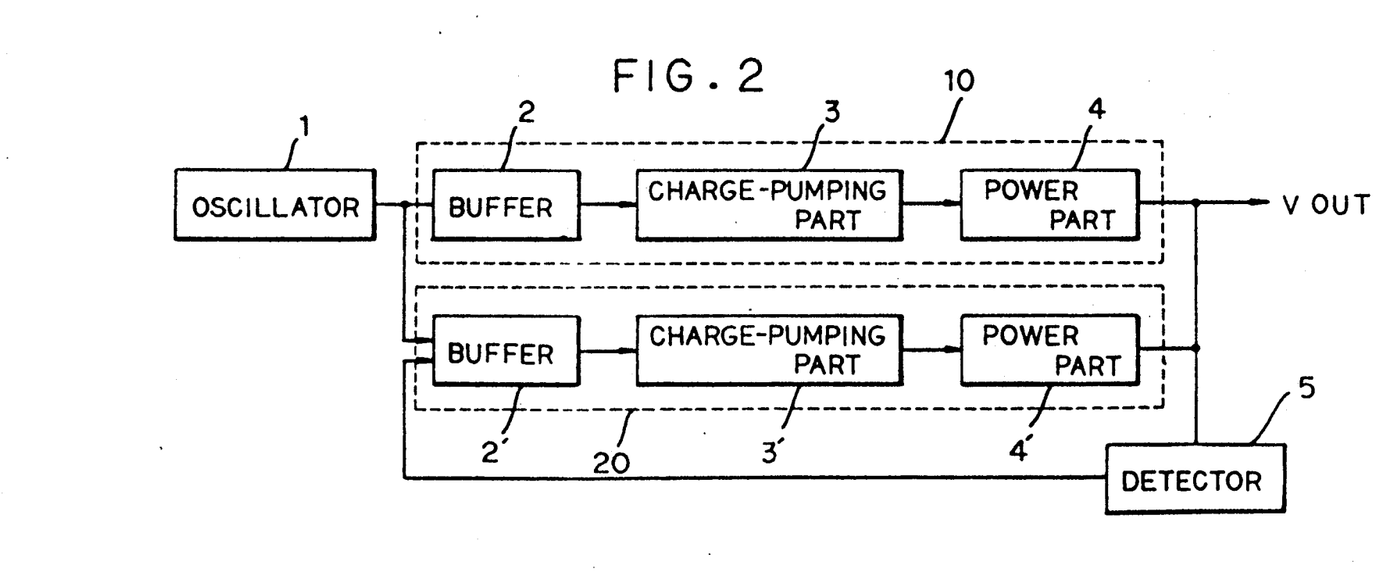
FIG. 2 is a block diagram of an internal voltage converter in semiconductor integrated circuit according to the present invention.

FIG. 2 is a block diagram of the internal voltage converter in the semiconductor integrated circuit which improves the disadvantages of the circuit shown in FIG. 1. This internal voltage converter is divided into a sub circuit 10 and a main circuit 20. Both the sub circuit 10 and main circuit 20 include the buffers 2 and 2' to transmit the output of the oscillator 1, the charge-pumping parts 3 and 3' to generate the parameter-independent output by receiving the output of the buffers 2 and 2', and the power parts 4 and 4' to provide the supply voltage VOUT by receiving the output of the charge-pumping part, respectively. The oscillator 1 constructed of the inverters or Schmitt triggers is connected to both buffers 2 and 2' of the sub circuit 10 and main circuit 20, respectively and the common node G of said power parts 4 and 4' is connected to a detector 5.

The detector 5 provides a control signal depending on the state of the output supply voltage, VOUT to the buffer 2 in the main circuit 20. There is a phase difference of 180 degrees between the output of the buffer in the main circuit 20 controlled by the output of the detector 5 and that of the buffer in the sub circuit 10 not controlled by the output of the detector 5. Thus, the power parts 4 and 4' of the sub circuit 10 and the main circuit 20 provide the supply voltage in turn. Here, the oscillator 1 is connected in common to the buffers 2 and 2' of both circuit 10 and 20, but each oscillator can be independently used in the sub circuit 10 and the main circuit 20. Moreover, even though the internal voltage converter includes one sub circuit 10 and one main circuit 20, it can be composed of many voltage converting stages in parallel. Even if this case, an oscillator 1 can be used in common or many oscillators corresponding to the number of the converter can be used.

In the internal voltage converter shown in FIG. 2, the output of the oscillator 1 is applied to the charge-pumping part 3 through the buffer 2 and the parameter-independent output is provided through the power part 4 as the supply voltage VOUT.

As this, the provided output voltage from the sub circuit 10 is used as the stand-by voltage. At this time, the detector 5 detects the voltage of the output stage, so if the supply voltage VOUT is dropped abruptly in the case of providing the starting voltage or driving the load connected to the output stage, then the detector 5 drives the main circuit 20 to provide the necessary current for driving of the load. Thus, in the present invention, the size of the component in the sub circuit 10 to provide the stand-by voltage must be small, while that of the component in the main circuit 20 operated according to the state of the internal voltage or operating conditions needs to be large.

Figure 3:
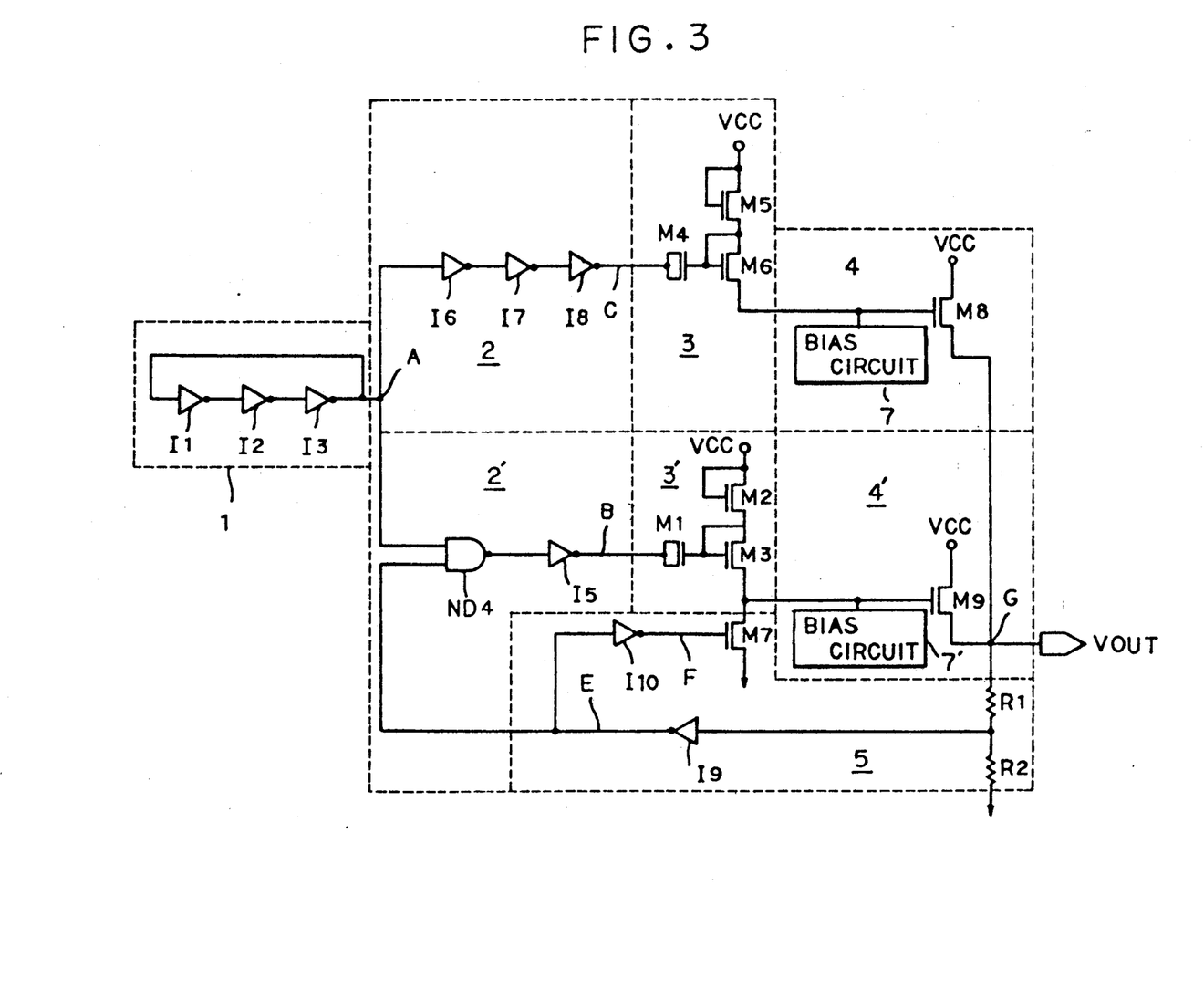
FIG. 3 illustrates an embodiment of an internal voltage converter in semiconductor integrated circuit according to the present invention.

FIG. 3 is a realized circuit diagram of the internal voltage converter in the semiconductor integrated circuit. In FIG. 3, the oscillator 1 consists of three inverters I1, I2 and I3. This oscillator can also consist of schmitt triggers. The oscillator 1 generates the square-wave pulse.

Similarly, the buffer 2 includes three inverters I6-I8. The charge-pumping parts 3 and 3' includes MOS transistors M1 and M4 to make capacitors, and other transistors M2-M3 and M5-M6, respectively. Also, the power parts 4 and 4' include bias circuits 7 and 7' to limit the voltage for a constant voltage and power transistors M8 and M9, respectively. The detector 5 to feedback the output voltage VOUT toward the input side includes voltage-dividing resistors R1, R2 inverters I9, I10 and a MOS transistor M7 to limit the output. In addition, one input of a NAND gate ND4 included in the buffer 3 consisting of the NAND gate ND4 and a inverter I5 is connected to the node E between two inverters I9 and I10.

The present invention of such composition will be now described in detail with reference to FIG. 5. The oscillator 1 constructed of the inverters or Schmitt triggers provides the square-wave pulse of a specified frequency to a node A. The voltage of the node A is applied to the buffers 2 and 2', thereby driving the charge-pumping part 3 and 3', respectively. The output after the buffer 2 is applied to the MOS capacitor transistor M4, and the output voltage is pumped by the square-wave voltage across the capacitor. The MOS transistor M6 provides the excited voltage to the power part 4.

Similarly, the operation of the other charge-pumping part 3' is the same with that of the part 3. Thus, the power parts 4 and 4' drive the power MOS transistors M8 and M9, being controlled by the bias circuits 7 and 7', to provide the internal supply voltage VOUT to the semiconductor chip. Also, the detector 5 is connected to the node G to detect the voltage VOUT and provide it after the division by the resistors R1 and R2. The inverters I9 and I10 limit a gate path toward the node B of the buffer 2' by detecting the internal voltage. Thus, when the internal voltage of the integrated circuit goes down, the high level signal of the inverter I9 is applied to an input terminal of a NAND gate ND4 so that the NAND gate ND4 provides a low level signal. After this signal is inverted to the high level signal by the inverter I5, it is applied to the charge-pumping part 3' to raise the supply voltage VOUT at the output stage.

By contrast, when the internal voltage rises, the state signal divided by the resistors R1 and R2 is in a high level state and it is inverted to a low level state by the inverter I9. Thus, the output of the NAND gate ND4 becomes the high level state and the inverted signal by the inverter I5, the low level state, is applied to the charge-pumping part 3', thereby making the operation of the charge-pumping part cut off. Also, the low level signal at the node B becomes the high level state by the inverter I10, thereby making the MOS transistor M9 cut off surely.

As this, the detector 5 controls the ON-OFF operation of the main circuit 20 by controlling the gate path of the buffer 2'. Thus, in the case of the stand-by mode, the only sub circuit 10 acts to provide the supply voltage VOUT to the inside of the integrated circuit, while in the case of the starting power supply, both the sub circuit 10 and the main circuit 20 act to provide the voltage VOUT.

Figure 4:
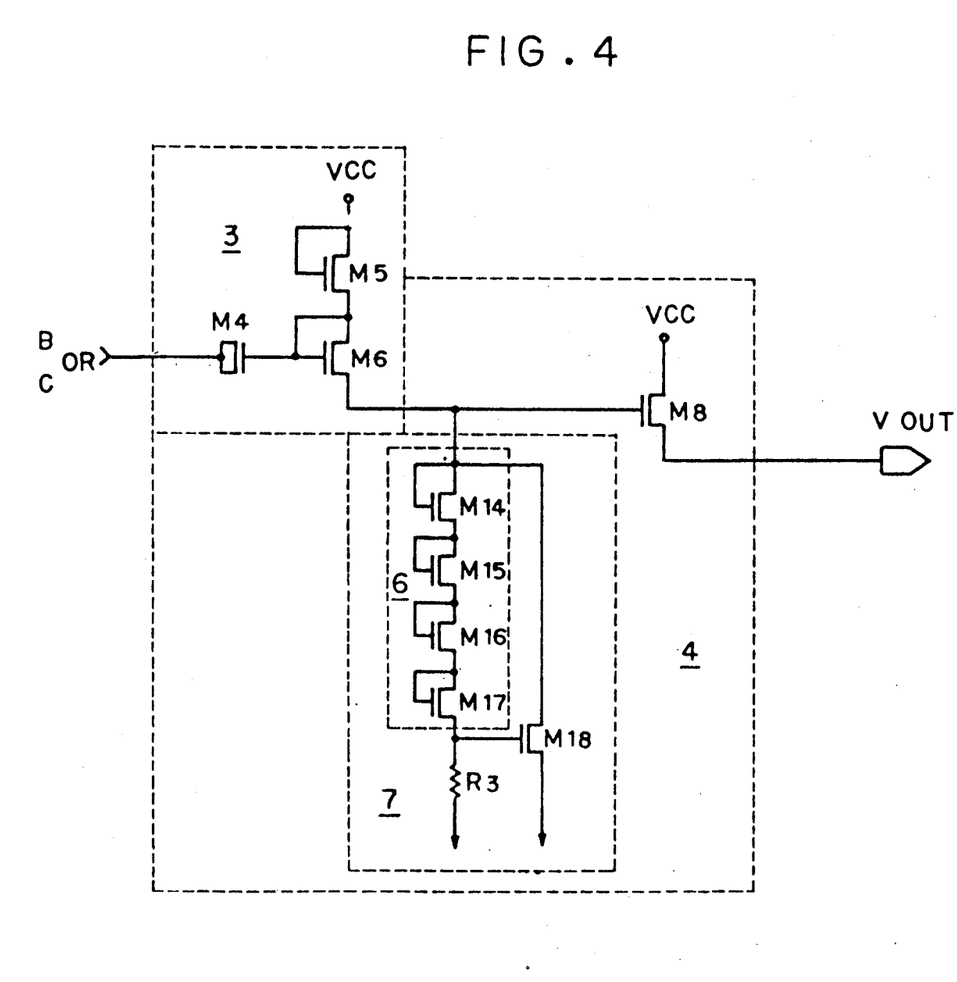
FIG. 4 shows a realized bias circuit in the present invention.
Figure 6:
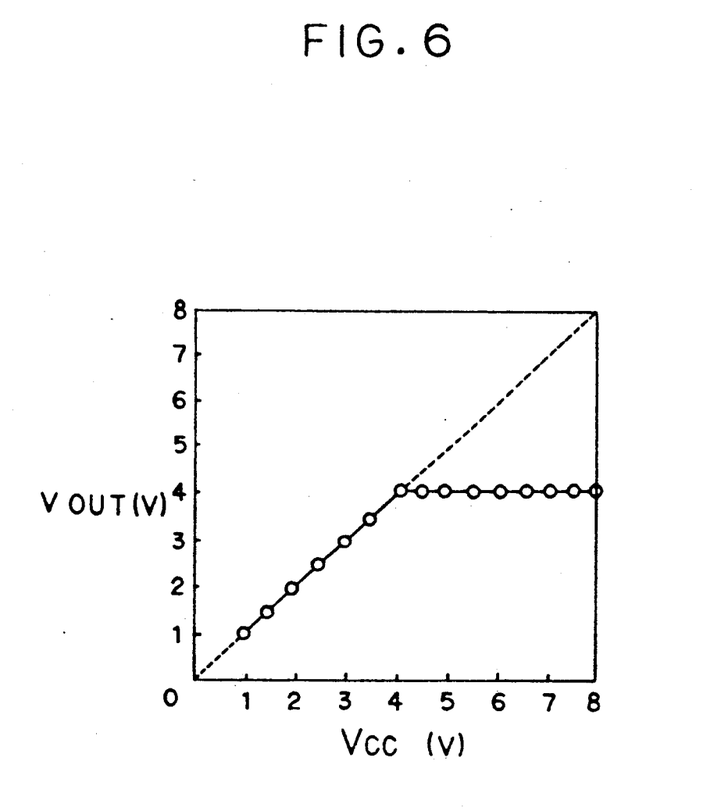
FIG. 6 shows an internal voltage of the internal voltage converter in semiconductor integrated circuit according to the present invention.

FIG. 4 is a realized circuit diagram of the present invention, representing the power part 4 connected to the rear of the charge-pumping part 3. The bias circuit 7 includes serial-connected MOS transistors M14-M17, a resistor R3, and a MOS transistor M18. In the bias circuit 7, the divided voltage by the MOS transistors M14-M17 acting as diodes and the resistor R3, makes the transistor M18 turn on so that the bias circuit 7 limits excess voltage above a specified constant voltage. Thus, the output voltage VOUT of the power MOS transistor M8 is clamped to about 4 VT (where, VT is a threshold voltage of the MOS transistor), so that the stable output voltage VOUT can be obtained. By using these bias circuits, the internal supply voltage VOUT can be held to the constant voltage level irrespectively of the external supply voltage. The relation between the external supply voltage VCC and the internal supply voltage VOUT is shown in FIG. 6.

Figure 5A:
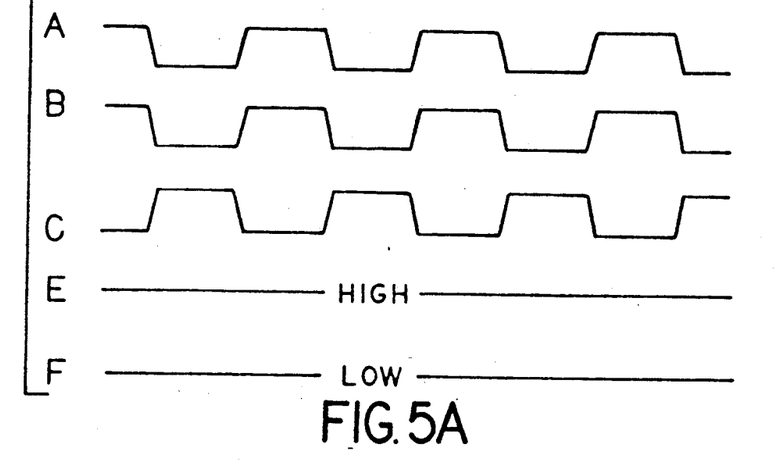
Figure 5B:
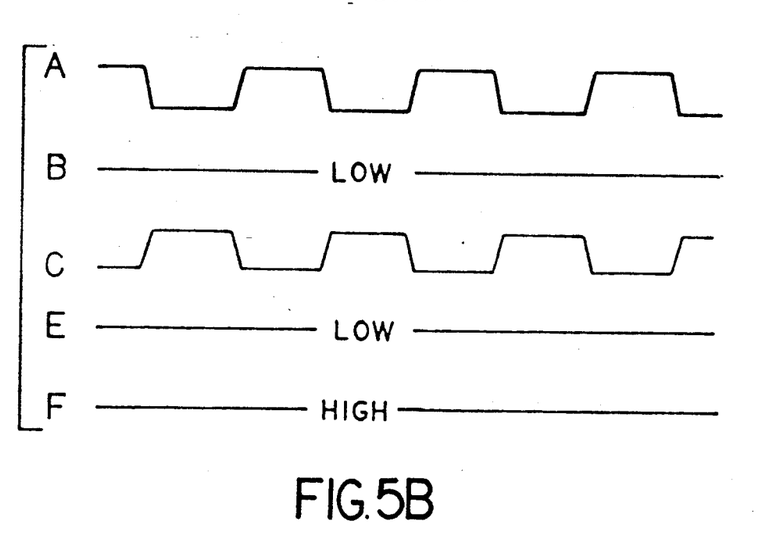

The operation relation shown in FIG. 5 will be now described. In the case that the large driving capability is needed as shown in FIG. 5(a) since the internal voltage is below the specified voltage level of the supply voltage VOUT, the high level output of the detector 5, the node B, enables the NAND gate ND4 of the buffer 2', thereby driving both charge-pumping circuit 3 and 3' at the same time. At this time, the MOS transistor M7 is cut off. In this case, the outputs of the buffers 2 and 2' has a phase difference by 180 degrees with each other, so the power transistors M8 and M9 of the power parts 4 and 4' are turned on in turn. Thus, the external supply voltage can provide fastly the internal voltage. But, in the case of stand-by mode as shown in FIG. 5(b), the output of the detector 5 becomes the low level state and disables the NAND gate ND4 of the buffer 2'. Also, the MOS transistor M7 is turned on and the power part 4' is cut off, so the only sub circuit 10 is driven to reduce the power consumption.

As mentioned above, the present invention can prevent the unnecessary power consumption and improve the stability of the internal voltage by composing of more one internal voltage converting stages in parallel, where the only sub circuit 10 is driven to provide the internal voltage in the case that the only stand-by voltage is needed, while the main circuit is driven according to the condition of the internal voltage. Particularly, even in the case of the large driving capability such as the starting power supply, all of the internal voltage converting stages can operate to fastly hold the constant level. Moreover, if the logic combination of the output at the node E of the detector 5 and the internal operating clock is used as a control clock of the internal voltage converter, the improved effect can be expected.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. An internal voltage converter in semiconductor integrated circuit, comprising:
   an oscillator for generating a square-wave signal;
   a sub-circuit including a buffer for receiving the square-wave signal of said oscillator, a charge-pumping circuit for generating a parameter-independent output by receiving an output of the buffer, a power part for controlling the output of the charge-pumping circuit to an internal voltage level and providing supply voltage from an external power source terminal; and
   a main circuit including a buffer for receiving the square-wave signal of said oscillator and a feedback signal at a feedback loop circuit being formed from an output terminal to the buffer, a charge-pumping circuit for generating a parameter-independent output by receiving an output of the buffer, a power part for controlling the output of the charge-pumping circuit to an internal voltage level and providing supply voltage from an external power source terminal, said internal voltage converter maintaining a predetermined internal voltage level independent of an applied voltage.

2. An internal voltage converter according to claim 1, further comprising at least one main circuit in form of a parallel connection, wherein the connection is formed between said main circuit and aid sub-circuit.

3. An internal voltage converter according to claim 1, wherein the buffer of said main circuit includes a logic combination means comprised of a NAND gating means and an inverting means for logic-combining the output signal of said oscillator with the feedback signal from the output terminal, both signals being out of phase by 180°.

4. An internal voltage converter according to claim 1, wherein said oscillator is commonly used for driving all said sub-circuits and said at least one main circuit.

5. An internal voltage converter according to claim 1, wherein a number of said oscillators is equal to that of the buffers.

6. An internal voltage converter according to claim 3, wherein said oscillator is commonly used for driving all said sub-circuits and said at least one main circuit.

7. An internal voltage converter according to claim 3, wherein a number of said oscillators is equal to that of the buffers.

* * * * *

REEXAMINATION CERTIFICATE (2075th)

United States Patent [19]

Min

[11] B1 5,072,134

[45] Certificate Issued Aug. 10, 1993

[54] INTERNAL VOLTAGE CONVERTER IN SEMICONDUCTOR INTEGRATED CIRCUIT

[75] Inventor: Dong-Sun Min, Seoul, Rep. of Korea

[73] Assignee: Samsung Electronics Co., Ltd., Suweon, Rep. of Korea

Reexamination Request:
No. 90/002,595, Feb. 12, 1992

Reexamination Certificate for:
Patent No.: 5,072,134
Issued: Dec. 10, 1991
Appl. No.: 484,107
Filed: Feb. 22, 1990

[30] Foreign Application Priority Data

Jun. 10, 1989 [KR] Rep. of Korea .................. 89-8067

[51] Int. Cl.$^5$ .................. H03K 3/013; H03K 3/353; G11C 7/02
[52] U.S. Cl. .................. 307/296.2; 307/296.8
[58] Field of Search .............. 307/296.1, 296.2, 296.3, 307/296.6; 323/283, 284, 271, 272

[56] References Cited

U.S. PATENT DOCUMENTS

| | | | |
|---|---|---|---|
| 4,471,290 | 9/1984 | Yamaguchi | 323/274 |
| 4,631,421 | 12/1986 | Inoue et al. | 307/296.2 |
| 4,733,108 | 3/1988 | Truong | 307/296 R |
| 4,794,278 | 12/1988 | Vajdic | 307/297 |
| 4,961,007 | 10/1990 | Kumanoya et al. | 307/296.2 |
| 4,964,082 | 10/1990 | Sato et al. | 365/189.09 |

OTHER PUBLICATIONS

Siemens Forschungs-und Entwicklungsberichte vol. 11, No. 3, 1982, pp. 120–126.

*Primary Examiner*—J. Zazworsky

[57] ABSTRACT

An internal voltage converter in semiconductor integrated circuit, comprises an oscillator, a sub circuit including a buffer and a charge-pumping circuit and a power part, a main circuit including a buffer and a charge-pumping circuit and a power part, and a detector. A plurality of voltage converting stages are composed in parallel to be divided when operating so that the unnecessary consumption of the power is reduced in the case of providing the stand-by power and the stability of the internal power supply voltage is also improved.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2, 3, 4, 6 and 7 are cancelled.

Claim 1 is determined to be patentable as amended.

Claim 5, dependent on an amended claim, is determined to be patentable.

1. [An] *In an* internal voltage converter [in] *of a* semiconductor integrated circuit[, comprising:] *having* an oscillator for generating a square-wave signal[;], a sub-circuit including a *first* buffer for receiving the square-wave signal of [said] *the* oscillator, a *first* charge-pumping circuit for generating a parameter-independent output by receiving an output of the buffer, a *first* power part for controlling the output of the charge-pumping circuit to an internal voltage level and providing *a* supply voltage from an external power source terminal[; and], a main circuit including a *second* buffer for receiving the square-wave signal of [said] *the* oscillator and a feedback signal [at] *of a* feedback loop circuit [being] *formed* from an output terminal to the *second* buffer, *a second* charge-pumping circuit for generating a *second* parameter-independent output by receiving an output of the *second* buffer, *and a second* power part for controlling the output of the *second* charge-pumping circuit to [an] *said* internal voltage level and providing *a second* supply voltage from [an] *the* external power source terminal, [said] *the* internal voltage converter maintaining a predetermined internal voltage level independent of an applied voltage, *an improvement of the internal voltage converter comprising:*

*a detecting circuit (5) for controlling operation of the second buffer (2') in the main circuit (20) in accordance with the condition of a supply voltage applied from the output terminal to a substrate, the detecting circuit operating the main circuit whenever the output of the sub-circuit drops below a predetermined voltage level and being connected between the commonly-connected outputs of the first (4) and the second (4') power parts and an input of the second buffer (2') of the main circuit whereby the sub-circuit needs to supply only the minimum power consumed by the integrated circuit.*

* * * * *